(12) United States Patent
Tran et al.

(10) Patent No.: US 6,504,742 B1
(45) Date of Patent: Jan. 7, 2003

(54) 3-D MEMORY DEVICE FOR LARGE STORAGE CAPACITY

(75) Inventors: Lung T. Tran, Saratoga, CA (US); Thomas C. Anthony, Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/984,934

(22) Filed: Oct. 31, 2001

(51) Int. Cl.[7] ................................................. G11C 5/02

(52) U.S. Cl. ............................ 365/51; 365/55; 365/171

(58) Field of Search ........................... 365/51, 55, 163, 365/171, 113, 115

(56) References Cited

U.S. PATENT DOCUMENTS

| | | | | |
|---|---|---|---|---|
| 5,481,493 A | * | 1/1996 | Bergemont | 365/185.02 |
| 6,157,356 A | * | 12/2000 | Troutman | 345/205 |
| 6,185,122 B1 | * | 2/2001 | Johnson et al. | 365/103 |

* cited by examiner

Primary Examiner—David Lam (57) ABSTRACT

A random access memory (memory) includes one or more planes of memory arrays stacked on top of each other. Each plane may be manufactured separately, and each array within the plane may be enabled/disabled separately. In this manner, each memory array within the plane can be individually tested, and defective memory arrays may be sorted out, which increases the final yield and quality. A memory plane may be stacked on top of each other and on top of an active circuit plane to make a large capacity memory device. The memory may be volatile or non-volatile by using appropriate memory cells as base units. Also, the memory plane may be fabricated separately from the active circuitry. Thus the memory plane does not require a silicon substrate, and may be formed from a glass substrate for example. Further, each memory plane may be individually selected (or enabled) via plane memory select transistors. The array may be individually selected (or enable) via array select transistor. These transistors may be formed from amorphous silicon transistor(s) and/or thin-film transistor(s). The data bus, array select bus, and the plane select bus provide electrical connections between the memory planes and the active circuit plane via side contact pads on each plane. 3-D memory for large storage capacity. The memory may be formed from one or more planes with each plane including one or more memory arrays. Each memory array of each plane may be separately enabled or disabled. The memory array may be formed on silicon or non-silicon based substrate. An active circuit plane may be shared among the memory arrays and planes to perform read and write functions.

27 Claims, 5 Drawing Sheets

3-D MEMORY DEVICE FOR LARGE STORAGE CAPACITY

RELATED APPLICATIONS

The following applications of the common assignee may contain some common disclosure and may relate to the invention, and are hereby incorporated by reference:

U.S. patent application Ser. No. 09/964,770, entitled "VERTICALLY ORIENTED NANO-FUSE AND NANO-RESISTOR CIRCUIT ELEMENTS";

U.S. patent application Ser. No. 09/964,768, entitled "ONE TIME PROGRAMMABLE FUSE/ANTI-FUSE COMBINATION BASED MEMORY CELL";

U.S. patent application Ser. No. 09/924,500, entitled "ONE-TIME PROGRAMMABLE UNIT MEMORY CELL BASED ON VERTICALLY ORIENTED FUSE AND DIODE AND ONE-TIME PROGRAMMABLE MEMORY USING THE SAME";

U.S. patent application Ser. No. 09/924,577, entitled "ONE-TIME PROGRAMMABLE MEMORY USING FUSE/ANTI-FUSE AND VERTICALLY ORIENTED FUSE UNIT MEMORY CELLS";

FIELD OF THE INVENTION

This invention relates generally to memory devices. More particularly, the invention relates to 3-dimensional large storage random access memory devices.

BACKGROUND OF THE INVENTION

There is an ever-increasing demand for dense and large storage capacity in devices such as computers, communication equipments, consumer electronics, etc. This has led to great improvements in the storage and performance of data storage devices such as hard disk drives, solid-state memories, etc. In hard disk drives, small form factors in conjunction with great improvement in area density permitted development of high capacity disk drives.

In integrated circuits, the development of multi-chip modules (MCM) and hybrid manufacturing techniques have led to great reduction in size, and in some cases improved performance in the final product. A commonly used MCM configuration for the dynamic random access memories (DRAM) is the single-in-line memory modules (SIMM). Presently, many memory storage devices are limited to a single layer. This is due generally to two factors. First, active circuitry requires silicon as the base material to support the operation of the memory such as reading and writing. To read and write, address decoders, read/write control logic, sense amplifiers, output buffers, multiplexers, and more are included in a memory chip. These are generally referred to as overhead and typically consume 20–30 percent of the physical memory. Preferably, this overhead is kept low so more space is available for memory. Second factor limiting the memory storage device to a single array layer is the power dissipation constraints.

Recently, multiple array memories fabricated on top of complementary metal oxide semiconductor (CMOS) have been proposed. However, such approach requires via(s) for each memory layer so that each memory layer may be individually connected to the active circuitry. This approach may yield a very dense and efficient memory design for a few layers. But as number of layers increases, the number of via(s) increases to the point where it become difficult to route the signals from memory arrays to the CMOS layer and the routing paths become longer such that this design become less efficient, more complex, and the cost increases as well. The vias may be made small to overcome some of the problems. However, smaller vias correspondingly increase the risk of defects and increase the difficulty in alignment. In addition, interconnects between array layers becomes more difficult and complex.

In addition, the yield of the memory devices is relatively low. The low yield is due to the fact that an individual memory layer cannot be sorted and rejected from a stack of layers. To illustrate, if a single memory layer has a probability p(x) of being defective, then it is readily apparent that an MCM memory made of multiple layers has a probability greater than p(x) of having at least one defective layer. Because of the inability to sort and reject defects on an individualized memory layer level, the overall quality of the memory device suffers and, thus, the yield is low.

SUMMARY OF THE INVENTION

In one respect, an exemplary embodiment of a memory array may include a non-silicon based substrate. The memory array may also include a row conductor formed above the non-silicon based substrate and extending in a row direction and a column conductor formed above the non-silicon based substrate and extending in a column direction such that a cross-point is formed at an intersection between the row conductor and the column conductor. In the cross point, a memory cell may be formed. The memory array may further include an array enable circuit connected to enable/disable at least one of the row conductor and the column conductor.

In another respect, an exemplary embodiment of a memory plane may include a non-silicon based substrate and one or more memory arrays formed above the nonsilicon based substrate. Each memory array may include a row conductor extending in a row direction and a column conductor extending in a column direction such that a cross-point is formed at an intersection between the row conductor and the column conductor. Each memory array may also include a memory cell formed in the cross-point, and an array enable circuit connected to enable/disable at least one of the row conductor and the column conductor.

In a further respect, an exemplary embodiment of a memory device may include an active circuit plane, for example CMOS circuit plane, and one or more memory planes formed above the active circuit plane. Each memory plane may include a non-silicon based substrate one or more memory arrays formed above the non-silicon substrate. Each memory array of each memory plane may include a row conductor extending in a row direction and a column conductor extending in a column direction such that a cross-point is formed at an intersection between the row conductor and the column conductor. Each memory array may also include a memory cell formed in the cross-point, and an array enable circuit connected to enable/disable at least one of the row conductor and the column conductor.

In yet another respect, an exemplary embodiment of a method to fabricate a memory device may include forming an active circuit plane and forming one or more memory planes above the active circuit plane. The method may also include forming a non-silicon based substrate for each memory plane. For each memory plane, the may further include forming one or more memory arrays above the non-silicon substrate. In addition, for each memory array, the method may include forming a row conductor extending in a row direction and forming a column conductor extending in a column direction such that a cross-point is formed at an intersection between the row conductor and the column conductor. The method may still further include forming a memory cell in the cross-point and forming an array enable circuit connected to enable/disable at least one of the row conductor and the column conductor for each memory array.

The above-disclosed embodiments of the present invention may be capable of achieving certain aspects. For example, the memory device may be made with stacking multiple planes of memory arrays, with each plane being fabricated individually. This eliminates the need to fabricate vias and thus the relative complexity of the device is reduced. Also, each array may be individually enabled and disabled, for example through an array select line. Thus defective arrays and/or planes may be sorted out prior to completing the device, which results in increased yield and quality. Further, because the memory planes may be made separately from the active circuitry, substrates of the memory planes may be formed from materials other than silicon. Further yet, memory planes without including overheads such as read/write control logic, sense amplifiers, output buffers, and multiplexers may be fabricated, which increases the capacity by enabling more space to be dedicated to memory. Still further, stacking allows very high capacity to be achieved. In addition, the memory may be volatile, non-volatile, random access or one-time programmable.

BRIEF DESCRIPTION OF THE DRAWINGS

Features and advantages of the invention will become apparent to those skilled in the art from the following description with reference to the drawings, in which.

DETAILED DESCRIPTION

For simplicity and illustrative purposes, the principles of the invention are described by referring mainly to exemplary embodiments thereof. However, one of ordinary skill in the art would readily recognize that the same principles are equally applicable to many types of solid-state memories and methods of fabricating and using thereof.

In accordance with the principles of the invention, fabricating multiple layers of memory arrays on top of one another may increase the capacity of a memory device. In an aspect of the invention, planes of memory arrays may be stacked to form a three-dimensional (3-D) memory device. Each plane may incorporate one or more memory arrays.

Figure 1A:
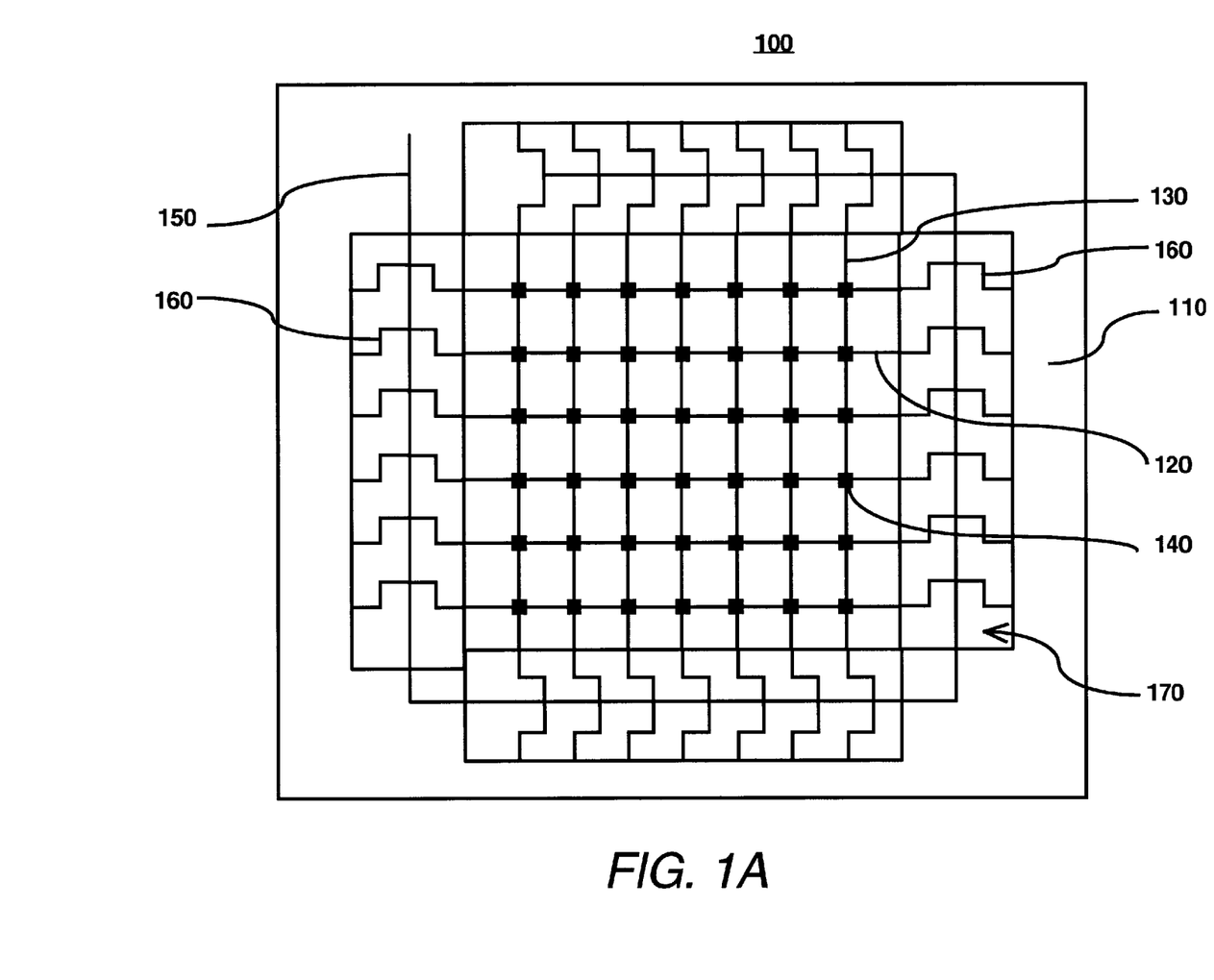
FIG. 1A illustrates an exemplary embodiment of a memory array according to the principles of the invention.

FIG. 1A illustrates an exemplary embodiment of a memory array 100 according to the principles of the invention. As shown in FIG. 1A, the memory array 100 may include a substrate 110. The substrate 110 may be silicon or non-silicon based. Examples of non-silicon based substrate include materials of plastic, glass, ceramics, non-metals such as electrical insulators, and the like.

Above the substrate 110, one or more row conductors 120 and one or more column conductors 130 may be formed. The row and column conductors 120 and 130 may extend in a row direction and column direction, respectively, to form a cross-point at each intersection. At a cross-point, a memory cell 140 may be formed. Each memory cell 140 may be individually addressable through the respective row and column conductors 120 and 130, respectively. The memory cell 140 may be read-only, randomly accessible, or one-time programmable, thus allowing the memory array 100 to be a read-only memory (ROM), random access memory (RAM), or one-time programmable memory (OTP), respectively. For example, the memory cell 140 may be a fuse memory cell, a fuse/diode memory cell, a fuse/anti-fuse memory cell, a magnetic memory cell, a diode memory cell, a magnetic/diode memory cell, a phase change memory cell, a resistive element cell, and the like.

The memory array 100 may also include an array enable circuit 170. The array enable circuit 170 may include one or more array enable transistors 160. For example, four groups of array enable transistors 160 are shown in FIG. 1A. Each row or column conductor, 120 or 130, respectively, may be connected to one or more array enable transistors 160. For example, as shown in FIG. 1A, each row or column conductor, 120 or 130, respectively, may be connected to two array enable transistors 160 on both ends. Conduction through the row conductor 120 or the column conductor 130 is enabled or disabled through controlling the array enable transistors 160. The array-enable transistors 160 may be formed from microcrystalline silicon transistors, amorphous silicon transistors, or any enable switches that do not require silicon substrate.

The memory array 100 may further include an array select line 150 connected to the array-enable transistors 160. By controlling the signal to the array select line 150, the memory array 100 may be selected or disabled. Typically, in a multiple arrays setting, a single array line 150 is dedicated to one array 100 and is not shared with any other array 100.

Figure 1B:
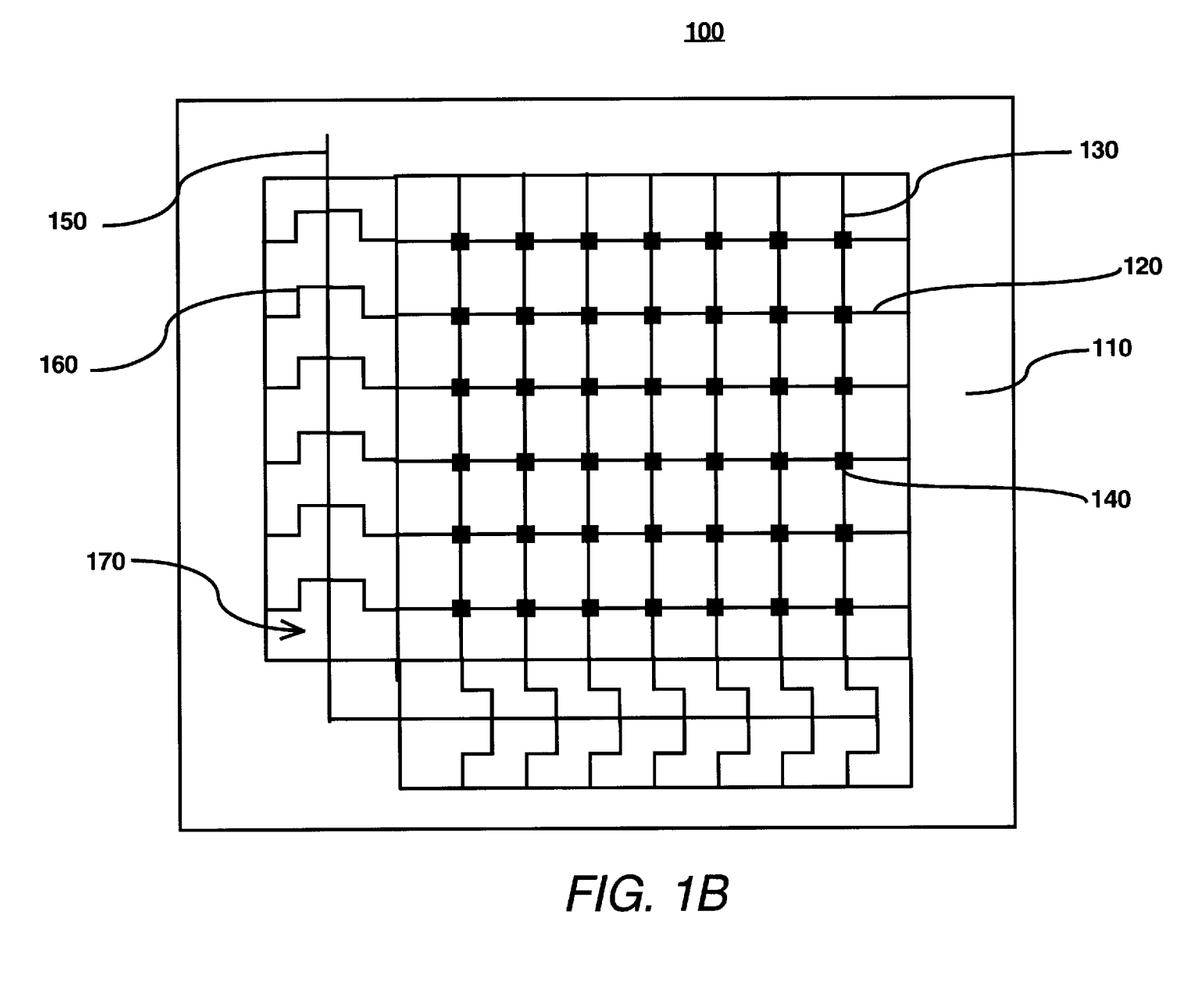
FIG. 1B illustrates a second exemplary embodiment of a memory array according to the principles of the invention.

Note that it's not necessary that both ends of the row or the column conductor 120 or 130 be connected to the array-enable transistor 160. FIG. 1B illustrates a second exemplary embodiment of a memory array according to the principles of the invention. As shown, only one of the ends of the row and column conductors, 120 and 130, respectively, are connected to the array enable transistors 160. Configurations other than FIGS. 1A and 1B are possible without departing from the scope of the invention.

Regardless of whether the memory array 100 is silicon or non-silicon based, it is note worthy that the memory array need not include overhead such as sense amplifiers, output buffers, decoders, multiplexers, and the like. A single active circuitry layer may provide the memory location selections, sense amplifiers, and read and write controls.

While individual memory arrays 100 may be stacked to form a 3-D memory device, planes of memory arrays may be fabricated according to another aspect of the present invention. The planes of memory arrays then may be sorted and stacked to form a 3-D memory device, which relatively increases the storage capacity of the device.

Figure 2:
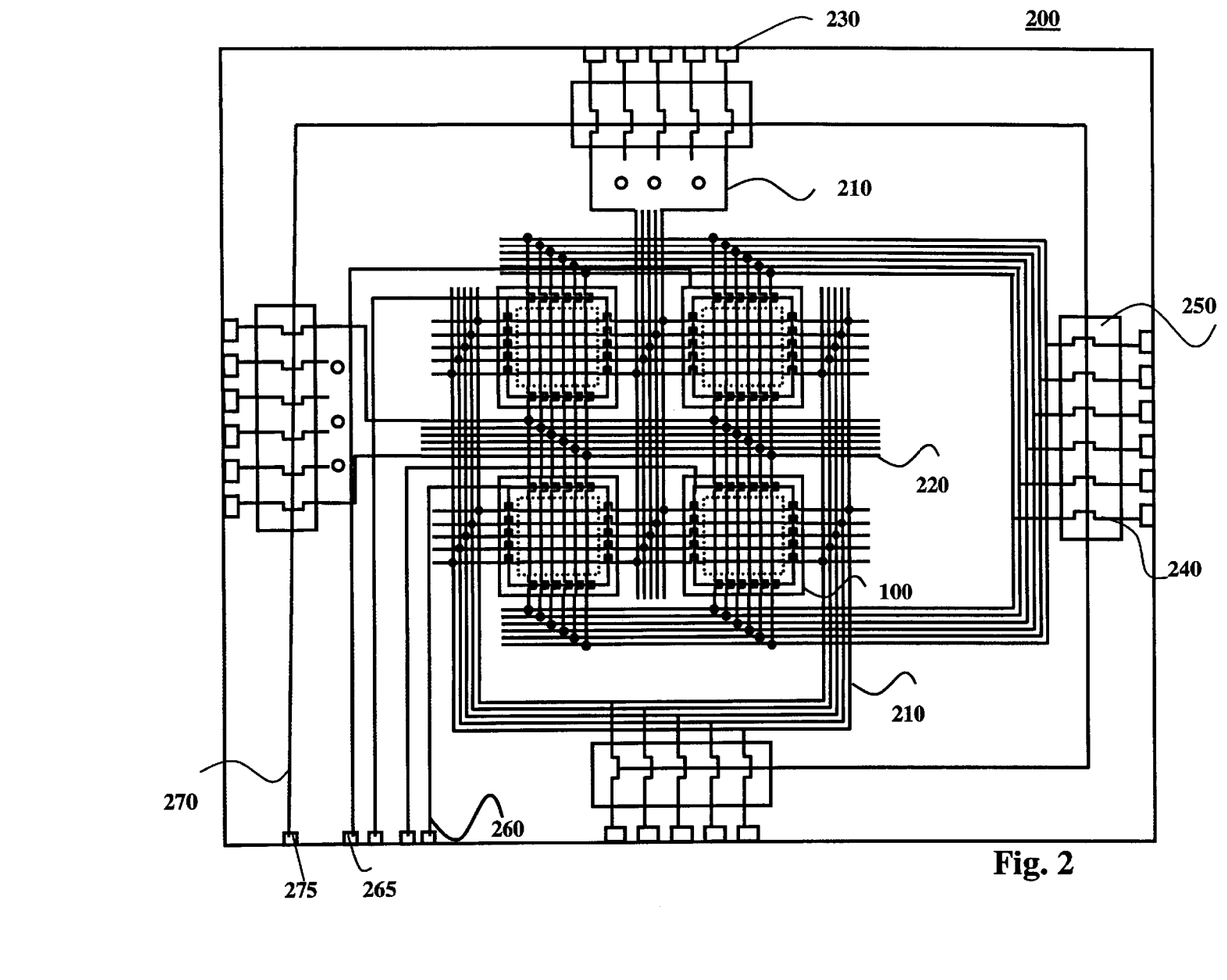
FIG. 2 illustrates an exemplary embodiment of a memory plane according to the principles of the invention.

FIG. 2 illustrates an exemplary embodiment of a memory plane 200 according to the principles of the invention. As shown in FIG. 2, the memory plane 200 may include one or more memory arrays 100, for example the memory arrays 100 of FIGS. 1A and 1B, formed above the substrate 110 (not shown). Again, the substrate 110 may be silicon or non-silicon based. The memory plane 200 may also include one or more row buses 210 and one or more column buses 220. The row buses 210 may electrically connect to the row conductors 120 (not labeled) of the memory arrays 100. Similarly, the column buses 220 may electrically to the column conductors 130 (also not labeled) of the memory arrays 100. Through the row and column buses 210 and 220, an individual memory cell 140 (not shown in FIG. 2) of individual memory arrays 100 may be addressed.

The memory plane 200 may further include a plane enable circuit 250. The plane enable circuit 250 may include one or more plane-enable transistors 240. For example, four groups of plane-enable transistors 240 are shown in FIG. 2. Data flow to and from the row and column buses, 210 and 220, and consequently from the memory cells 140 (not shown in FIG. 2) of the memory arrays 100 may be enabled or disabled through controlling the plane enable transistors 240. The plane-enable transistor 240 may be formed from microcrystalline thin-film transistor, amorphous thin-film transistor, or any enable switch that do not require silicon substrate.

A plane select line 270 may be included in the memory plane 200, in which the plane select line 270 is connected to the plane enable transistors 240. In this manner, by controlling the signal to the plane select line 270, the memory plane 200 may be enabled or disabled.

The memory plane 200 may yet further include one or more data side contact pads 230. The data side contact pads 230 may electrically connect with the row and column buses, 210 and 220, via the plane enable transistors 240. The memory plane 200 may be fabricated so that when multiple memory planes 200 are stacked, the data side contact pads 230 of the memory planes 200 are aligned for the next conductor process step to form data buses 310 (see FIG. 3). In this manner, the need to fabricate the interconnect vias between planes may be eliminated and the relative complexity of the device may be reduced.

Note that the array select line 150 of individual memory arrays 100 may come together to form a plurality of array select lines 260. The memory plane 200 and the active circuit plane 390 may be fabricated so that when multiple memory planes 200 are stacked together, the data side contact pads 230 are aligned that ease the interconnection of multiple memory planes and the active circuit plane. A deposition, plating or screening conductor process step may be used for the interconnections and to form array select bus 330 (see FIG. 3). Since the conductors of the array select bus 330 are physically wide, this process is easily accomplished.

Figure 3:
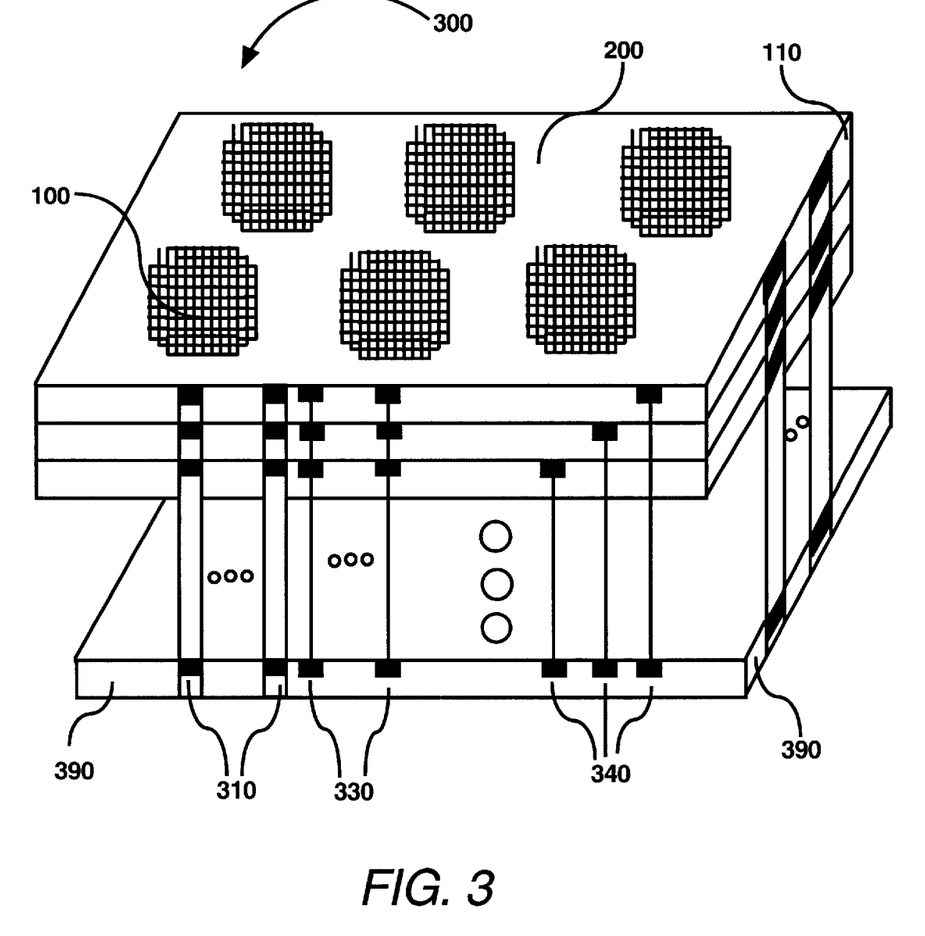
FIG. 3 illustrates an exemplary embodiment of a memory device according to the principles of the invention.

FIG. 3 illustrates an exemplary embodiment of a memory device 300 according to the principles of the invention. As shown, the memory device 300 may include one or more memory planes 200 stacked to form a 3-D memory. The memory device 300 may also include an active circuit plane 390. The active circuit plane 390 may be built on a silicon substrate and may contain circuits necessary to address the memory arrays 100 of memory planes 200 including overhead elements such as address decoders, read/write control logic, sense amplifiers, output buffers, multiplexers.

The memory device 300 may further include one or more data buses 310. The data buses 310 may be formed from a conductor process step to connect the aligned data side contact pads 230 (see FIG. 2) of the memory planes 200. Note that the active circuit plane 390 may also include data side contact pads that are aligned and electrically connected to the data side contact pads 230 of the memory planes 200 as well.

The memory device 300 may still further include the array select bus 330. The array select bus 330 may be formed from a conductor process that connect electrically the plurality of array select lines 260 through the array select side contact pads 265 on the memory planes 200 and the array select side contact pads on the active plane 390. Note that the active circuit plane 390 may also include array select lines and array select side contact pads that aligned with the array select side contact pad 265 of the memory planes 200 as well.

The memory device 300 may include a plane select bus 340. The plane select bus 340 may be formed from combination of the plane select lines 270 and a plane select side contact pad 275 (see FIG. 2) of individual memory planes. A conductor process step interconnects electrically the plane select lines 270 via the plane select side contact pad 275 on the individual memory planes 200 to the active circuit plane 390. Each plane 200 may have a separate plane select line 270, but the array select bus 330 may shared among the planes 200.

Figure 4:
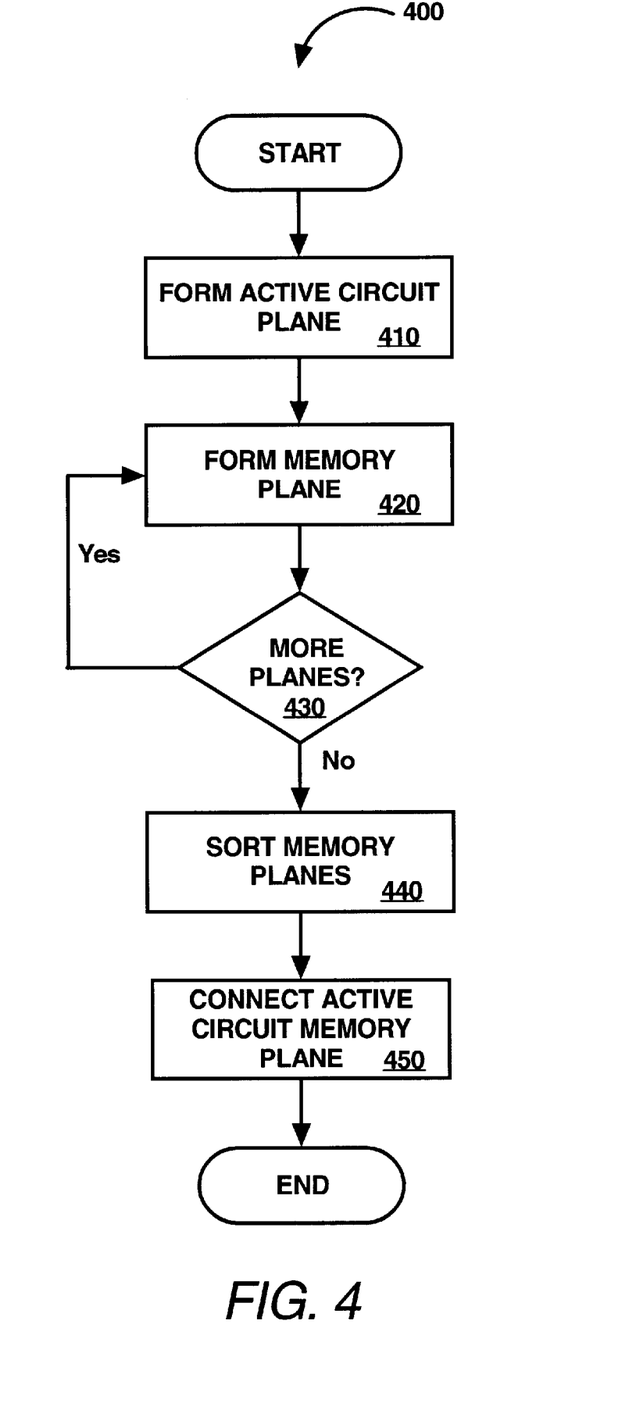
FIG. 4 is a flow chart representing an exemplary method to fabricate the memory device of FIG. 3 according to an aspect of the present invention.

FIG. 4 is a flow chart representing an exemplary method 400 to fabricate the memory device 300 of FIG. 3 according to an aspect of the present invention. As shown in FIG. 4, the active circuit plane 390 may be fabricated (step 410). Also, one or more memory planes 210 may be fabricated (steps 420 and 430). Note that fabricating the active circuit plane 390 may take place before, after, or simultaneously with fabricating the memory planes 200.

Then, the memory planes 200 may be sorted according to a predetermined error threshold (step 440). For example, a threshold may be set to reject any memory plane 200 with more than 10% of the memory arrays 100 being defective. Thus if each memory plane 200 has sixteen memory arrays 100, then a plane 200 with more than one defective array 100 will be rejected. Such control assures that the resulting device meets a preset tolerance for defects. To sort out bad a memory plane, a tester or an electronics assembly that have read/write and control functions similar to the active circuit plane may be used. The screening step 440 is done at wafer probe testing stage before the wafers are diced into individual planes 200. A wafer may contain several planes 200.

Indeed, multiple threshold levels may be used to sort the memory planes 200. For example, it may be possible that certain applications may be able to tolerate more defects than others. In this manner, varying defect tolerance levels can be assured in the memory devices.

Then to complete the process, the active circuit plane 390 and the memory planes 200 may be stacked and bonded with adhesive material to hold them together (step 450). The stacking process also aligned the side contact pads (data 230, array select 265, and plane select 275) of the memory planes 200 and the active circuit planes 390. The conductor process forms the plane interconnect conductors 310, 330, and 340 to make electrical connections between memory planes and the active circuit plane. The memory stacks are then sent through a packaging process to form the memory device 300.

While the invention has been described with reference to the exemplary embodiments thereof, those skilled in the art will be able to make various modifications to the described embodiments of the invention without departing from the true spirit and scope of the invention. For example, the terms "row" and "column" are merely relative, and do not imply any fixed orientation. Also, "rows" and "columns" are interchangeable, in that others may refer to "rows" what this document calls columns and vice versa. The terms "row" and "column" do not necessarily imply an orthogonal relationship, although that is what has been illustrated herein. The terms and descriptions used herein are set forth by way of illustration only and are not meant as limitations. In particular, although the method of the invention has been described by examples, the steps of the method may be performed in a different order than illustrated or simultaneously. Those skilled in the art will recognize that these and other variations are possible within the spirit and scope of the invention as defined in the following claims and their equivalents.

What is claimed is:

1. A memory array, comprising:
   a non-silicon based substrate;
   one or more row conductors formed above said non-silicon based substrate and extending in a row direction;
   one or more column conductors formed above said non-silicon based substrate and extending in a column direction such that a cross-point is formed at each intersection between said row and column conductors;
   a memory cell formed in one or more of said cross-points;
   an array-enable circuit configured to enable/disable said memory array; and
   an array select line connected to said array-enable circuit, wherein the memory array can be individually sorted and stacked.

2. The memory array of claim 1, wherein said non-silicon based substrate is formed from base materials of at least one of a plastic, glass, ceramic, and non-metal.

3. The memory array of claim 1, wherein said memory cell includes at least one of a fuse memory cell, a fuse/diode memory cell, a fuse/anti-fuse memory cell, a magnetic memory cell, a diode memory cell, a magnetic/diode memory cell, a phase change memory cell, and a resistive element cell.

4. The memory array of claim 1, wherein said array enable-circuit includes at least one of a microcrystalline silicon thin-film transistor and an morphous thin-film transistor.

5. A memory array, comprising:
   a substrate;
   one or more row conductors formed above said substrate and extending in a row direction;
   one or more column conductors formed above said substrate and extending in a column direction such that a cross-point is formed at each intersection between said row and column conductors;
   a memory cell formed in one or more of said cross-points;
   an array enable circuit configured to enable/disable said memory array; and
   an array select line connected to said array-enable circuit;
   wherein said memory array excludes sense amplifiers, output buffers, decoders, and multiplexers and wherein the memory array can be individually sorted and stacked.

6. The memory array of claim 5, wherein said memory cell includes at least one of a fuse memory cell, a fuse/diode memory cell, a fuse/anti-fuse memory cell, a magnetic memory cell, a diode memory cell, a magnetic/diode memory cell, phase change memory cell, and a resistive element cell.

7. A memory plane, comprising:
   a substrate;
   a plurality of array select lines formed above said substrate;
   a plane-enable circuit formed above said substrate and configured to enable/disable said memory plane;
   a plane select line electrically connected to said plane-enable circuit; and
   one or more memory arrays formed above said substrate, wherein at least one memory array includes:
      one or more row conductors formed above said substrate and extending in a row direction;
      one or more column conductors formed above said substrate and extending in a column direction such that a cross-point is formed at each intersection between said row and column conductors;
      a memory cell formed in one or more of said cross-points; and
      an array-enable circuit configured to enable/disable said memory array and electrically connected at least one of said plurality of array select lines.

8. The memory plane of claim 7, further comprising:
   a row bus electrically connected to said one or more row conductors of said one or more memory arrays; and
   a column bus electrically connected to said one or more column conductors of said one or more memory arrays.

9. The memory plane of claim 7, wherein said substrate is silicon based and wherein each of said one or memory arrays excludes sense amplifiers, output buffers, decoders, and multiplexers.

10. The memory plane of claim 7, wherein said substrate is non-silicon based and is formed from base materials of at least one of a plastic, glass, ceramic, and non-metal.

11. The memory plane of claim 7, wherein said memory cell includes at least one of a fuse memory cell, a fuse/diode memory cell, a fuse/anti-fuse memory cell, a magnetic memory cell, a diode memory cell, a magnetic/diode memory cell, a phase change memory cell, and a resistive element cell.

12. A memory device, comprising:
   an active circuit plane;
   a data bus electrically connected to said active circuit plane;
   a plane select bus electrically connected to said active circuit plane;
   an array select bus electrically connected to said active circuit plane; and
   one or more memory planes stacked above said active circuit plane, wherein at least one memory plane includes:
      a substrate;
      a plurality of array select lines formed above said substrate and electrically connected to said array select bus;
      a plane-enable circuit configured to enable/disable said memory plane;
      a plane select line electrically connected to said plane enable-circuit and to said plane select bus; and
      one or more memory arrays formed above said substrate, wherein at least one memory array includes:
         one or more row conductors formed above said substrate and extending in a row direction;
         one or more column conductors formed above said substrate and extending in a column direction such that a cross-point is formed at each intersection between said row and column conductors;
         a memory cell formed in one or more of said cross-points; and
         an array-enable circuit configured to enable/disable said memory array and electrically connected at least one of said plurality of array select lines.

13. The memory device of claim 12, wherein said at least one memory plane further comprises:

a row bus electrically connected to said one or more row conductors of said one or more memory arrays; and a column bus electrically connected to said one or more column conductors of said one or more memory arrays.

14. The memory device of claim 13, wherein said at least one memory plane further comprises at least one of:

a plurality of data side contact pads electrically connected to said row and column buses;

a plurality of array select side contact pads electrically connected to said array elect lines; and a plane select side contact pad electrically connected to said plane select line.

15. The memory device of claim 14, wherein at least one of:

said plurality of data side contact buses are aligned and electrically connected to said data bus;

said plurality array select side contact pads are aligned and electrically connected to said array select bus; and said plane select side contact pad are electrically connected with a line of said plane select bus.

16. The memory device of claim 12, wherein said plurality of array select lines of said memory planes are electrically connected to from said array select bus.

17. The memory device of claim 12, wherein said substrate of said at least one memory plane is silicon based and wherein each of said one or memory arrays excludes sense amplifiers, output buffers, decoders, and multiplexers.

18. The memory plane of claim 12, wherein said substrate of said at least one memory plane is non-silicon based and is formed from base materials of at least one of a plastic, glass, ceramic, and non-metal.

19. The memory plane of claim 12, wherein said memory cell includes at least one of a fuse memory cell, a fuse/diode memory cell, a fuse/anti-fuse memory cell, a magnetic memory cell, a diode memory cell, a magnetic/diode memory cell, a phase change memory cell, and a resistive element cell.

20. A method to fabricate memory device, comprising:

forming an active circuit plane; and forming a data bus electrically connected to said active circuit plane;

forming a plane select bus electrically connected to said active circuit plane;

forming an array select bus electrically connected to said active circuit plane;

forming one or more memory planes to be stacked above said active circuit plane, wherein at least one memory plane is fabricated by:

forming a substrate;

forming a plurality of array select lines above said substrate and electrically connected to said array select bus;

forming a plane enable circuit configured to enable/disable said memory plane;

forming a plane select line electrically connected to said plane enable circuit and to said plane select bus; and forming one or more memory arrays above said substrate, wherein at least one memory array is fabricated by:

forming one or more row conductors above said substrate and extending in a row direction;

forming one or more column conductors above said substrate and extending in a column direction such that a cross-point is formed at each intersection between said row and column conductors;

forming a memory cell in one or more of said cross-points; and forming an array enable circuit configured to enable/disable said memory array and electrically connected at least one of said plurality of array select lines.

21. The method of claim 20, wherein said step of forming said at least one memory planes further comprises:

forming a row bus electrically connected to at least one of said one or more row conductors of at least one of said one or more memory arrays; and forming a column bus electrically connected to at least one of said one or more column conductors of at least one of said one or more memory arrays.

22. The method of claim 20, wherein said step of forming said at least one memory planes further comprises at least one of:

forming a plurality of data side contact pads electrically connected to said row and column buses;

forming a plurality of array select side contact pads electrically connected to said array select lines; and forming a plane select side contact pad electrically connected to said plane select line.

23. The method of claim 22, wherein at least one of:

said plurality of data side contact buses are aligned and electrically connected to said data bus;

said plurality array select side contact pads are aligned and electrically connected to said array select bus; and said plane select side contact pad are electrically connected with a line of said plane select bus.

24. The method of claim 20, wherein said plurality of array select lines of said memory planes are electrically aligned to from an array select bus.

25. The method of claim 20, wherein said substrate of at least one of said at least one memory plane is silicon based and wherein each of said one or memory arrays excludes sense amplifiers, output buffers, decoders, and multiplexers.

26. The method of claim 20, wherein said substrate of at least one of said at least one memory plane is non-silicon based and is formed from base materials of at least one of a plastic, glass, ceramic, and non-metal.

27. The method of claim 20, wherein said memory cell includes at least one of a fuse memory cell, a fuse/diode memory cell, a fuse/anti-fuse memory cell, a magnetic memory cell, a diode memory cell, a magnetic/diode memory cell, a phase change memory cell, and a resistive element cell.

* * * * *